(12) United States Patent
Hong et al.

(10) Patent No.: US 9,656,797 B2
(45) Date of Patent: May 23, 2017

(54) DISPLAY PANEL STORING DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Yanping Hong, Beijing (CN); Wenhao Wang, Beijing (CN); Liping Liu, Beijing (CN); Huixuan Ma, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/803,670

(22) Filed: Jul. 20, 2015

(65) Prior Publication Data
US 2016/0135592 A1 May 19, 2016

(30) Foreign Application Priority Data
Nov. 17, 2014 (CN) .......................... 2014 1 0654886

(51) Int. Cl.
*H01L 21/673* (2006.01)
*B65D 85/48* (2006.01)
(Continued)

(52) U.S. Cl.
CPC ........... *B65D 85/48* (2013.01); *G02F 1/1303* (2013.01); *H01L 21/00* (2013.01); *H01L 21/6734* (2013.01); *H01L 21/67309* (2013.01)

(58) Field of Classification Search
CPC .... B65D 85/48; B65D 25/06; H05K 13/0069; Y10S 206/832; H01L 21/673;
(Continued)

(56) References Cited

U.S. PATENT DOCUMENTS 3,879,027 A * 4/1975 Thurmond, Jr. ...... B25H 1/0014
211/22
4,600,231 A * 7/1986 Sickles .............. H05K 13/0069
206/707
(Continued)

FOREIGN PATENT DOCUMENTS

CN 202219920 U 5/2012
CN 202558081 U 11/2012
(Continued)

OTHER PUBLICATIONS

English translation of CN 203781022, foreign reference published Aug. 20, 2014.*
(Continued)

*Primary Examiner* — Daniel J Troy
*Assistant Examiner* — Hiwot Tefera
(74) *Attorney, Agent, or Firm* — Nath, Goldberg & Meyer; Joshua B. Goldberg

(57) ABSTRACT

The present invention provides a display panel storing device, having a framework; two support frames, which are opposite to each other and slidably connected to the framework, for supporting a display panel therebetween; and a driving unit for driving the two support frames to move towards or away from each other to change the distance between the two support frames. The display panel storing device can simplify the adjustment procedure, increase efficiency, and reduce manpower cost, and is unnecessary to detect the symmetry of the two support frames.

12 Claims, 5 Drawing Sheets

(51) Int. Cl.
*G02F 1/13* (2006.01)
*H01L 21/00* (2006.01)

(58) Field of Classification Search
CPC ........... H01L 21/6734; H01L 21/67309; H01L 21/67383; H01L 21/67373; G02F 1/1303
USPC .......... 211/41.17, 1.51, 41.1, 1.57, 189, 194, 211/201, 41.18, 41.12, 41.14, 41.15; 206/708, 710, 386
See application file for complete search history.

(56) References Cited

U.S. PATENT DOCUMENTS

| | | | | |
|---|---|---|---|---|
| 4,761,044 A * | 8/1988 | Akama | ................ | H05K 7/1418 312/110 |
| 4,782,948 A * | 11/1988 | Weise | .................... | A63B 55/50 206/315.7 |
| 5,660,122 A * | 8/1997 | Sickles | .............. | H05K 13/0069 108/193 |
| 6,030,060 A * | 2/2000 | Drake | .................. | H05K 7/1425 206/708 |
| 6,098,808 A * | 8/2000 | Matsuda | ............ | H05K 13/0069 206/708 |
| 6,155,426 A * | 12/2000 | Matsuda | ............ | H05K 13/0069 206/707 |
| 6,209,405 B1 * | 4/2001 | Milsem | .................. | A47B 46/00 108/138 |
| 6,250,728 B1 * | 6/2001 | Thorp | .................... | A47B 51/00 292/32 |
| 6,328,169 B1 * | 12/2001 | Matsuda | .............. | H05K 7/1418 211/175 |
| 6,681,523 B1 * | 1/2004 | Stener | ....................... | E06B 9/00 160/216 |
| 6,701,669 B1 * | 3/2004 | Yorgason | ................ | E06B 7/096 49/82.1 |
| 6,755,382 B1 * | 6/2004 | Melnick | ................ | A47K 10/38 242/596.1 |
| 7,163,110 B2 * | 1/2007 | Huang | ................ | H01L 21/6734 211/41.18 |
| 7,246,708 B2 * | 7/2007 | Chuang | .................. | A47B 57/10 211/41.18 |
| 7,469,502 B1 * | 12/2008 | Steel | ......................... | E05C 9/06 49/463 |
| 7,543,783 B2 * | 6/2009 | Ollard | ....................... | A47F 7/28 206/477 |
| 7,819,261 B2 * | 10/2010 | Mayuzumi | ............ | B65D 21/08 211/26 |
| 2003/0132176 A1 * | 7/2003 | Takano | ............... | H01L 21/6734 211/41.1 |
| 2006/0226094 A1 * | 10/2006 | Cho | ........................ | B65D 85/48 211/41.18 |
| 2006/0231515 A1 * | 10/2006 | Chou | .................. | H01L 21/6734 211/41.18 |
| 2008/0258587 A1 * | 10/2008 | Mayuzumi | ............. | B65D 21/08 312/111 |

FOREIGN PATENT DOCUMENTS

| | | |
|---|---|---|
| CN | 103183182 A | 7/2013 |
| CN | 203781022 U | 8/2014 |
| KR | 101302191 B1 | 9/2013 |
| KR | 20130117022 A | 10/2013 |
| KR | 20140100726 A | 8/2014 |

OTHER PUBLICATIONS

Office Action dated Dec. 16, 2015 issued in corresponding Chinese Application No. 201410654886.1.

* cited by examiner

DISPLAY PANEL STORING DEVICE

FIELD OF THE INVENTION

The present invention relates to the field of liquid crystal display technology, and particularly to a display panel storing device.

BACKGROUND OF THE INVENTION

With the development of the liquid crystal display technology and decrease of manufacturing cost of the liquid crystal display, thin film transistor liquid crystal displays (TFT LCDs) with characteristics such as low power consumption, no radiation and the like have become the mainstream of the liquid crystal display market. During manufacturing TFT LCDs, storage of the display panels is very important. Since production line for the display panels may produce products with various sizes, display panel storing device is required to store products with various sizes so as to meet the requirements of the production line.

FIG. 1 is a top view of an existing display panel storing device, FIG. 2 is a front view of the display panel storing device shown in FIG. 1, and FIG. 3 is a partially enlarged view of the display panel storing device shown in FIG. 1. As shown in FIGS. 1-3, the display panel storing device 1 comprises: a top frame 11, a bottom frame 12, two side frames 13, two mono-sided support frames 14 which are parallel to the side frames 13, two top positioning strips 15 which are provided between the side frames 13 and parallel to the top frame 11, two bottom positioning strips (not shown in the figures), corresponding to the top positioning strips 15, which are provided between the side frames 13 and parallel to the bottom frame 12. Each of the mono-sided support frames 14 is provided thereon with support rods 140, which are parallel to the top frame 11 and the bottom frame 12 and face to the other mono-sided support frame 14, for supporting display panels. Each top positioning strip 15 includes two top positioning plates 17, and each bottom positioning strip includes two bottom positioning plates 18 corresponding to the top positioning plates 17. Specifically, the top positioning strips 15 and the bottom positioning strips are provided thereon with grooves, wherein the top positioning plates 17 are inserted into the grooves of the top positioning strips 15, and the bottom positioning plates 18 are inserted into the grooves of the bottom positioning strips, so as to easily replace the top positioning plates 17 and the bottom positioning plates 18. Each of the top positioning plates 17 is provided thereon with a plurality of first positioning holes 29 for fixing the mono-sided support frame 14, and each of the bottom positioning plates 18 is provided thereon with a plurality of second positioning holes 30, corresponding to the first positioning holes 29, for fixing the mono-sided support frame 14. The two mono-sided support frames 14 are provided therebetween with a double-sided support frame 26, which is parallel to the mono-sided support frames 14 and may form two storage spaces for storing display panels in cooperation with the two mono-sided support frames 14. The double-sided support frame 26 is also provided thereon with support rods 140 facing the mono-sided support frames 14 respectively for supporting display panels in cooperation with support rods 140 of the two mono-sided support frames 14 respectively. When sizes of the storage spaces needs to be adjusted to store display panels with various sizes, as shown in FIG. 3, the mono-sided support frame 14 is lifted up so that positioning end 31 of the mono-sided support frame 14 is detached from the first positioning hole 29 of the top positioning plate 17, next the mono-sided support frame 14 is moved to a corresponding first positioning hole 29 and a position corresponding to a corresponding second positioning hole 30 according to sizes of display panels to be stored, the mono-sided support frame 14 is pressed so as to be fixed into the first positioning hole 29 and the second positioning hole 30, thus the storage space is changed. If the top positioning plates 17 and the bottom positioning plates 18 have no positioning holes suitable for size of display panel, then the top positioning plates 17 and the bottom positioning plates 18 need to be replaced so as to change the size of the storage space.

The above display panel storing device has following problems:

First, when adjusting the storage spaces, it is required to replace the positioning plates or adjusting positions of the mono-sided support frames 14 according to the positioning holes on the positioning plates, such an adjustment is complicated and lengthy, and more labors are needed to cooperate to complete the adjustment, therefore, capacity of the production line is low, production efficiency is decreased, and manpower cost is increased.

Second, after the adjustment of the mono-sided support frames 14 has been completed, it is necessary to detect whether the mono-sided support frames 14 at two sides are symmetrical so as to avoid a case in which the storage space is too small to store display panels or a case in which the storage space is too large to support display panels, due to the fact that the mono-sided support frames 14 are not symmetrical.

Third, in addition to the above points, when adjusting the storage spaces, failures are easily caused by human or apparatus, which results in collision among an iron-hand, the display panel storing device and the display panel during the iron-hand is delivering the display panel, therefore, the iron-hand, the display panel storing device or the display panel may be damaged, resulting in large economic loss. In addition, more manpower and material resources may be used to repair the damaged iron-hand, display panel storing device or display panel.

Fourth, in general, in order to store display panels with various sizes, it is necessary to provide the display panel storing device 1 with various positioning plates, thus the manufacturing cost is increased.

Finally, in the above display panel storing device 1, the mono-sided support frames 14 are fixed by positioning holes, fixing tightness is poor, thus in transporting, the display panels are possible to slide and even drop due to shake.

SUMMARY OF THE INVENTION

The present invention is directed to solve one of technical problems existing in the prior art, and proposes a display panel storing device, which can simplify adjustment, improve efficiency and decrease manpower cost.

To realize the object of the present invention, the present invention provides a display panel storing device comprising: a framework; two support frames, which are opposite to each other and slidably connected to the framework, for supporting a display panel therebetween; and a driving unit for driving the two support frames to move towards or away from each other to change the distance between the two support frames.

Each of the support frames includes: a top positioning strip slidably connected to the top of the framework; a bottom positioning strip slidably connected to the bottom of the framework; and support pillars connected between the top positioning strip and the bottom positioning strip, each of the support pillars provided with support rods for carrying the display panel.

One of the two support frames has at least one support pillar, and the other one of the two support frames has at least two support pillars.

The driving unit includes a first driver and a second driver, and wherein the first driver is provided at the top of the framework for driving the top positioning strips of the two support frames to move towards or away from each other, and the second driver is provided at the bottom of the framework for driving the bottom positioning strips of the two support frames to move towards or away from each other.

The first driver and the second driver operate synchronously.

The first driver is connected to the top positioning strips of the two support frames through respective first transmission parts, and the second driver is connected to the bottom positioning strips of the two support frames through respective first transmission parts.

The first driver and the second driver are gears, and the first transmission parts and the second transmission parts are racks.

Each of the gears is provided with a knob for rotating the gear.

The display panel storing device further comprises locking parts for locking the first driver and the second driver respectively to prevent the first driver and the second driver from driving the top positioning strips of the two support frames to move towards or away from each other, and the bottom positioning strips of the support frames from moving towards or away from each other.

Each of the top and bottom of the framework is respectively provided with a fixing plate, and the fixing plates are arranged along a direction in which the top positioning strips move towards or away from each other and along a direction in which the bottom positioning strips move towards or away from each other, respectively.

The first driver is provided on the fixing plate arranged on the top of the framework, and the second driver is provided on the fixing plate arranged on the bottom of the framework.

Each of the fixing plates and the transmission parts is provided with a scaleplate.

The first driver and the second driver are provided at centers of the top and bottom of the framework respectively.

The present invention has following advantages:

In the display panel storing device of the present invention, two support frames are simultaneously driven by the drive unit to move towards or away from each other, compared to the prior art, adjustment is simpler, adjustment speed is faster, and operators needed in the adjustment are reduced, thus adjustment efficiency is increased and the manpower cost is decreased. Meanwhile, probability of failure occurring in the adjustment may be decreased so that large economic loss can be avoided. In addition, the two support frames move simultaneously, which may further improve speed of adjusting the distance between the two support frames, thus the efficiency is further improved. Also, the two support frames are symmetrical with each other in motion states, therefore, after the adjustment, step of detecting whether the two support frames are symmetrical may be omitted, which can further shorten time for adjusting the distance between the two support frames, and increase the efficiency.

BRIEF DESCRIPTION OF THE DRAWINGS

Accompanying drawings are used to provide further understanding of the present invention, constitute a part of the specification, and are used to explain the present invention together with following embodiments, but not to limit the present invention, wherein.

REFERENCE NUMERALS

1—display panel storing device; 2—top frame; 12—bottom frame; 13—side frame; 14—mono-sided support frame; 15—top positioning strip; 17—top positioning plate; 18—bottom positioning plate; 26—double-sided support frame; 29—first positioning hole; 30—second positioning hole; 31—positioning end; 140—support rod; 100—framework; 101, 102—support frame; 103, 104—driver; 105, 106, 107, 108—transmission part; 109—top positioning strip; 110—bottom positioning strip; 111—support pillar; 112—fixing plate; 1110—support rod; 1030, 1040—locking part.

DETAILED DESCRIPTION OF EMBODIMENTS

Embodiments will be described in detail below in conjunction with the accompanying drawings. It should be understood that, the embodiments described herein are only used to describe and explain the present invention, but not to limit the present invention.

Figure 1:
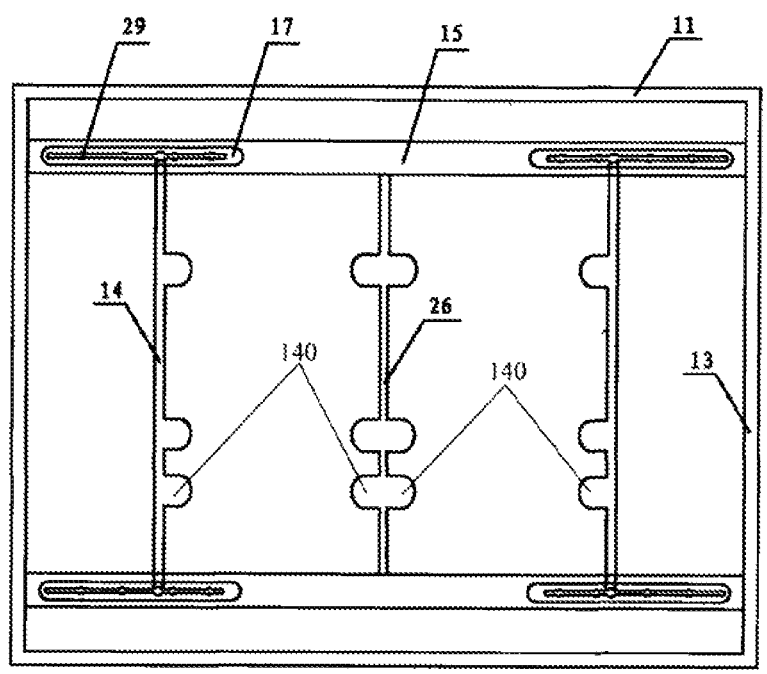
FIG. 1 is a top view of an existing display panel storing device.
Figure 2:
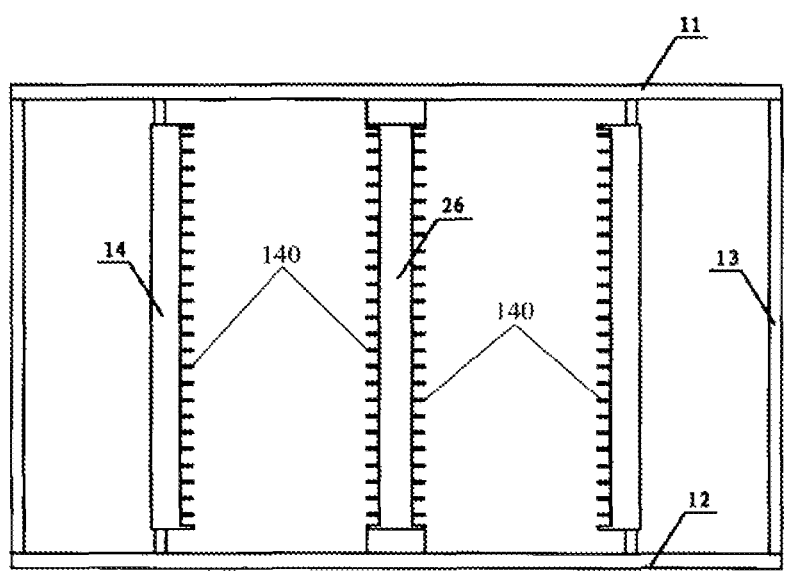
FIG. 2 is a front view of the display panel storing device shown in FIG. 1.
Figure 3:
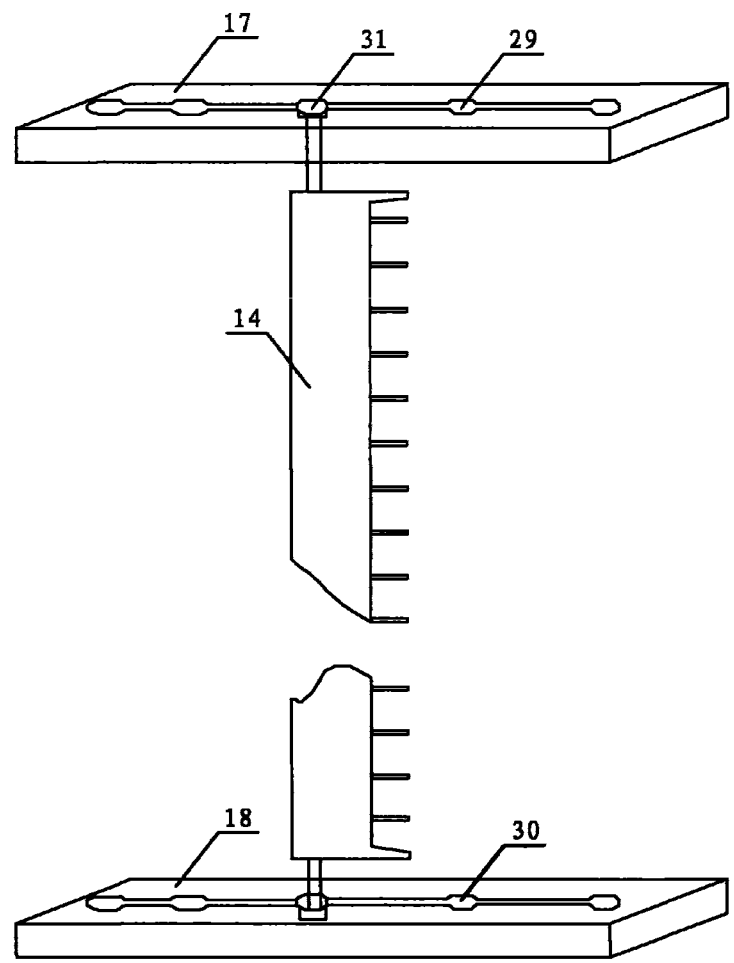
FIG. 3 is a partially enlarged view of the display panel storing device shown in FIG. 1.
Figure 4:
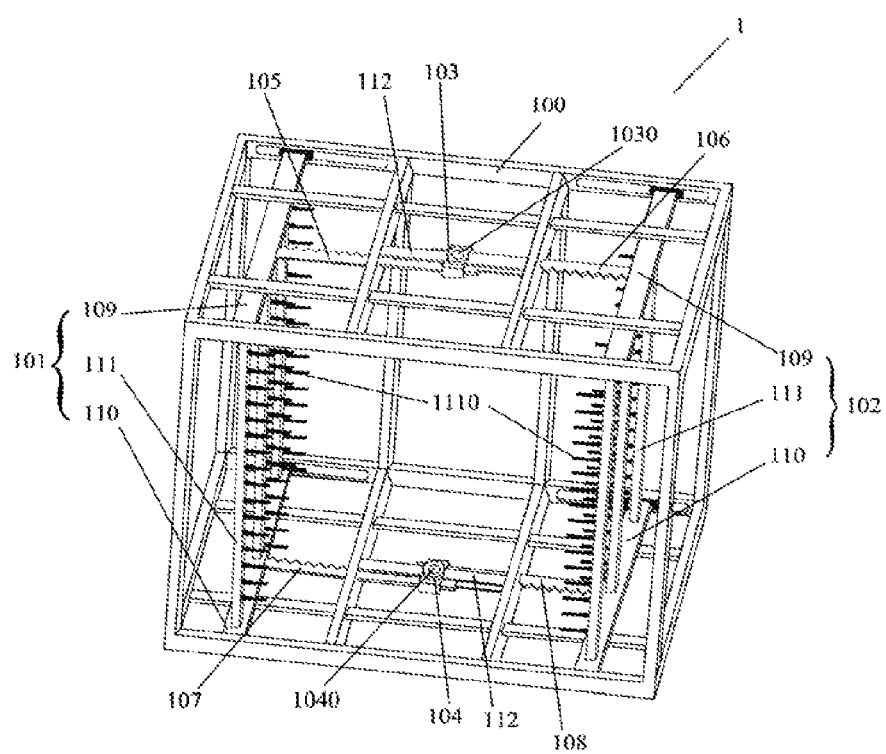
FIG. 4 is a diagram of a preferable embodiment of a display panel storing device of the present invention.
Figure 5:
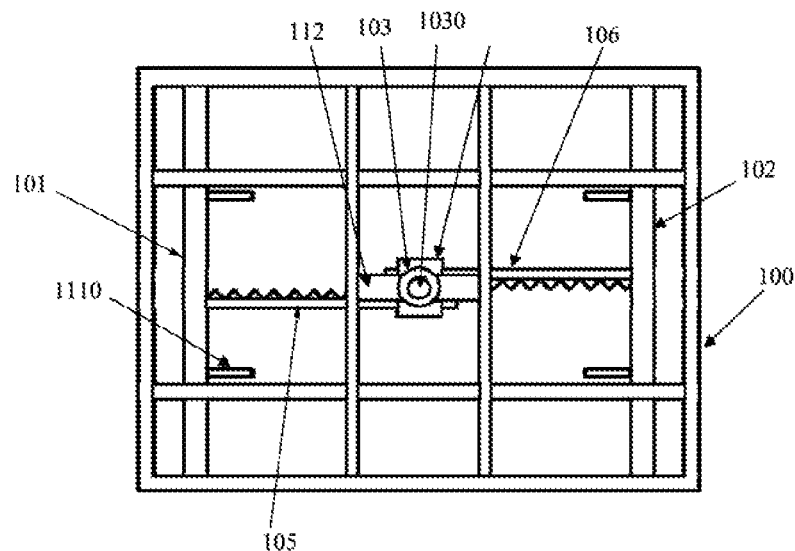
FIG. 5 is a top view of the display panel storing device shown in FIG. 4.

With reference to FIG. 4 and FIG. 5, FIG. 4 is a diagram of a preferable embodiment of a display panel storing device of the present invention; FIG. 5 is a top view of the display panel storing device shown in FIG. 4. In this embodiment, the display panel storing device 1 comprises a framework 100; two support frames 101 and 102, which are opposite to each other and slidably connected to the framework 100, for supporting a display panel therebetween; and a driving unit for driving the two support frames 101 and 102 to move towards or away from each other to change the distance between the two support frames 101 and 102.

In this embodiment, the driving unit simultaneously drives the two support frames 101 and 102 to move towards or away from each other to change the distance between the two support frames 101 and 102 so as to meet demand on storing display panels with various sizes. Compared to the prior art, adjustment of the distance between the two support frames 101 and 102 is simpler, thus time necessary for the adjustment is shortened, adjustment efficiency is increased and operators needed in the adjustment are also reduced, and the manpower cost is decreased. Meanwhile, probability of failure occurring in the adjustment may be decreased so that large economic loss can be avoided. Also, in this embodiment, the two support frames 101 and 102 are moved simultaneously, thus speed for adjusting the distance between the two support frames 101 and 102 is faster, specifically, the adjustment speed is doubled, therefore, time necessary for the adjustment is further shortened, and the adjustment efficiency is increased. In addition, in this embodiment, since motions of the two support frames 101 and 102 are symmetrical, it is unnecessary to detect the symmetry between the two support frames 101 and 102 after the adjustment, therefore, the adjustment procedure may be simplified and time necessary for the adjustment is further shortened.

Each of the support frames 101 and 102 includes: a top positioning strip 109 slidably connected to the top of the framework 100; a bottom positioning strip 110 slidably connected to the bottom of the framework 100; and support pillars 111 connected between the top positioning strip 109 and the bottom positioning strip 110, each of the support pillars 111 provided with support rods 1110 for carrying display panels. Specifically, the support rods 1110 on the support pillar 111 of the support frame 101 are parallel to the top and bottom of the framework 100 and face the support frame 102; the support rods 1110 on the support pillar 111 of the support frame 102 are parallel to the top and bottom of the framework 100 and face the support frame 101; and the support rods 1110 on the support pillar 111 of the support frame 101 and corresponding support rods 1110 on the support pillar 111 of the support frame 102 form a storage space for storing display panels.

Preferably, the support frame 101 has at least one support pillar 111, and the support frame 102 has at least two support pillar 111, by this configuration, each storage space for storing display panels may have at least three support points (that is, the support rods 1110 function as the support points) for supporting display panels, so that the display panels may be stable when the display panels are stored in the storage space of the display panel storing device 1.

The driving unit includes two drivers 103 and 104, which are respectively provided at the top and bottom of the framework 100, wherein the drivers 103 and 104 are used for driving the top positioning strips 109 of the two support frames 101 and 102 to move towards or away from each other, and driving the bottom positioning strips 110 of the two support frames 101 and 102 to move towards or away from each other.

Figure 6:
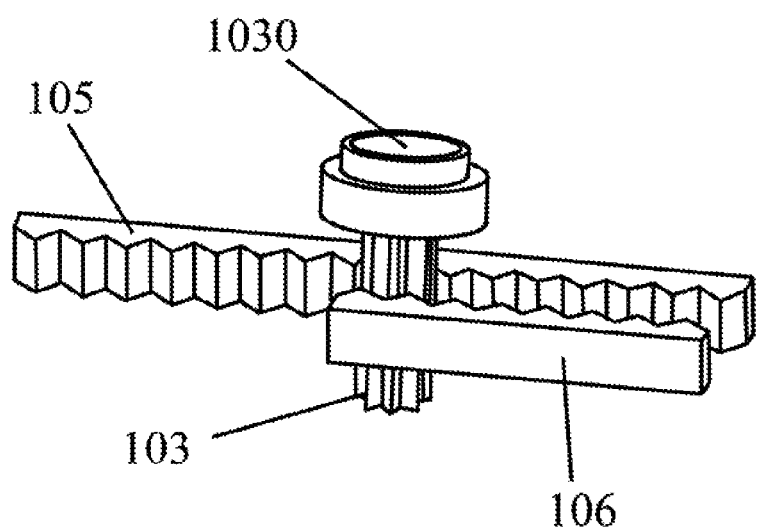
FIG. 6 is a diagram illustrating connection between a driver and a transmission part in the display panel storing device shown in FIG. 4.

Specifically, as shown in FIG. 6, the driver 103 is connected to the top positioning strips 109 of the two support frames 101 and 102 through transmission parts 105 and 106, and similarly, the second driver 104 is connected to the bottom positioning strips 110 of the two support frames 101 and 102 through transmission parts 107 and 108. By the drive of the driver 103, the transmission parts 105 and 106 drive the top positioning strips 109 of the two support frames 101 and 102 to move towards or away from each other, thus adjustment of the distance between top end of the pillar 111 of the support frame 101 and top end of the pillar 111 of the support frame 102 is realized; By the drive of the driver 104, the transmission parts 107 and 108 drive the bottom positioning strips 110 of the two support frames 101 and 102 to move towards or away from each other, thus adjustment of the distance between bottom end of the pillar 111 of the support frame 101 and bottom end of the pillar 111 of the support frame 102 is realized, so that a desired distance can be maintained between the pillar 111 of the support frame 101 and the pillar 111 of the support frame 102. Generally, the drivers 103 and 104 operate simultaneously.

After the desired distance is maintained between the pillar 111 of the support frame 101 and the pillar 111 of the support frame 102 through adjustment, a display panel can be placed into a corresponding storage space by an iron-hand. The support rods 1110 of the support pillars 111 of the support frames 101 and 102 function as support points for supporting the display panel, so that storage of the display panel is realized.

Preferably, the pillars 111 are perpendicular to the top and bottom of the framework 100. With such a configuration, a fixed relative position relationship between the support rods 1110 of the support frames 101 and 102 can be ensured in each storage space, so that all display panels stored in the display panel storing device have the same bearing force.

Specifically, in this embodiment, as shown in FIG. 6, the drivers 103 and 104 may be gears, and accordingly, the transmission parts 105, 106, 107 and 108 may be racks. Preferably, each gear is provided with a knob for rotating the gear, so as to drive the transmission part engaged with the gear to move.

Specifically, the display panel storing device also comprises locking parts 1030 and 1040 for locking the drivers 103 and 104 so as to prevent the drivers 103 and 104 provided on the top and bottom of the framework 100 from driving the top positioning strips of the support frames 101 and 102 from moving towards or away from each other, and the bottom positioning strips of the support frames 101 and 102 from moving towards or away from each other. With such a configuration, in a case of the distance between the support frames 101 and 102 being adjusted to a desired distance, the distance may be stably maintained without being changed, so that when a display panel is stored, the display panel can be prevented from deviating, and in turn the display panel can be prevented from dropping out of the display panel storing device 1.

Specifically, each of the top and bottom of the framework 100 is respectively provided with a fixing plate 112, and the fixing plates 112 are arranged along a direction in which the two top positioning strips 109 move towards or away from each other and along a direction in which the bottom positioning strips 110 move towards or away from each other, respectively. The drivers 103 and 1014 are respectively provided on the fixing plates 112 arranged on the top and bottom of the framework 100. Each of the fixing plates 112 and the transmission parts 105, 106, 107 and 108 is provided with a scaleplate. With such a configuration, the distance between the support frames 101 and 102 and size of a display panel to be stored can be accurately determined, so that when adjusting the distance between the support frames 101 and 102, the probability of operation error of a worker can be reduced, thus the economic loss due to the operation error can be avoided. Preferably, the scaleplate is provided thereon with identifiers indicating size of the display panel.

Preferably, the drivers 103 and 104 are provided at centers of the top and bottom of the framework 100 respectively. With such a configuration, the support frames 101 and 102 can reach ends of the framework 100 under the drive of the drivers 103 and 104, so that a maximum distance between the support frames 101 and 102 can be realized, and thus the use of the space can be maximized.

In summary, in the display panel storing device 1 of the present invention, two support frames 101 and 102 are simultaneously driven by the drive unit to move towards or away from each other, compared to the prior art, adjustment is simpler, adjustment speed is faster, and operators needed in the adjustment are reduced, thus adjustment efficiency is increased and the manpower cost is decreased. Meanwhile, probability of failure occurring in the adjustment may be decreased so that large economic loss can be avoided. In addition, the two support frames 101 and 102 move simultaneously, which may further improve speed of adjusting the distance between the two support frames 101 and 102, thus the efficiency is further improved. Also, the two support frames 101 and 102 are symmetrical with each other in motion states, therefore, after the adjustment, the step of detecting whether the two support frames 101 and 102 are symmetrical may be omitted, which can further shorten time for adjusting the distance between the two support frames, and increase the efficiency.

It should be understood that, the above embodiments are only exemplary embodiments used to explain the principle of the present invention and the protection scope of the present invention is not limited thereto. The person skilled in the art can make various variations and modifications without departing from the spirit and scope of the present invention, and these variations and modifications should be considered to belong to the protection scope of the invention.

The invention claimed is:

1. A display panel storing device, comprising:
a framework;
two support frames, which are opposite to each other and slidably connected to the framework, for supporting a display panel therebetween; and
a driving unit for driving the two support frames to move towards or away from each other to change the distance between the two support frames,
wherein the driving unit is provided between the two support frames for easy operation and simple structure, and
wherein the driving unit includes a first driver provided at the framework's top, and a second driver provided at the framework's bottom, and the first driver is provided on a fixing plate arranged on the top of the framework, and the second driver is provided on a fixing plate arranged on the bottom of the framework.

2. The display panel storing device of claim 1, wherein each of the support frames includes: a top positioning strip slidably connected to the top of the framework; a bottom positioning strip slidably connected to the bottom of the framework; and at least one support pillar connected between the top positioning strip and the bottom positioning strip, each support pillar provided with support rods for carrying the display panel.

3. The display panel storing device of claim 2, wherein one of the two support frames has at least one support pillar, and the other one of the two support frames has at least two support pillars.

4. The display panel storing device of claim 2, wherein the first driver is used for driving the top positioning strips of the two support frames to move towards or away from each other, and the second driver is used for driving the bottom positioning strips of the two support frames to move towards or away from each other.

5. The display panel storing device of claim 4, wherein the first driver and the second driver operate synchronously.

6. The display panel storing device of claim 4, wherein the first driver is connected to the top positioning strips of the two support frames through respective first transmission parts, and the second driver is connected to the bottom positioning strips of the two support frames through respective second transmission parts.

7. The display panel storing device of claim 6, wherein the first driver and the second driver are gears, and the first transmission parts and the second transmission parts are racks.

8. The display panel storing device of claim 7, wherein each of the gears is provided with a knob for rotating the gear.

9. The display panel storing device of claim 4, further comprising locking parts for locking the first driver and the second driver respectively to prevent the first driver and the second driver from driving the top positioning strips of the two support frames to move towards or away from each other, and the bottom positioning strips of the support frames from moving towards or away from each other.

10. The display panel storing device of claim 6, wherein the fixing plate provided at the top of the framework and the fixing plate provided at the bottom of the framework are arranged along a direction in which the top positioning strips move towards or away from each other and along a direction in which the bottom positioning strips move towards or away from each other, respectively.

11. The display panel storing device of claim 10, wherein each of the fixing plates and the transmission parts are provided with a scaleplate.

12. The display panel storing device of claim 4, wherein the first driver and the second driver are provided at centers of the top and bottom of the framework, respectively.

\* \* \* \* \*